United States Patent
Park et al.

(10) Patent No.: US 8,062,914 B2
(45) Date of Patent: Nov. 22, 2011

(54) METHOD FOR FABRICATING FLAT PANEL DISPLAY DEVICE

(75) Inventors: Jae Yong Park, Anyang-si (KR); Kwang Yeon Lee, Gwangmyeong-si (KR); Seung Kyu Lee, Gwangmyeong-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 12/613,029

(22) Filed: Nov. 5, 2009

(65) Prior Publication Data

US 2010/0047938 A1 Feb. 25, 2010

Related U.S. Application Data

(62) Division of application No. 11/639,698, filed on Dec. 14, 2006, now Pat. No. 7,638,803.

(30) Foreign Application Priority Data

May 17, 2006 (KR) .................. 10-2006-0044353

(51) Int. Cl.
*H01L 33/00* (2010.01)

(52) U.S. Cl. .................... 438/26; 438/27; 27/59; 27/72; 27/257

(58) Field of Classification Search .............. 257/57, 257/59, 72, 83, 257, 290, 351, 368, 392; 438/30, 48, 128, 149, 151, 157, 161, 283
See application file for complete search history.

(56) References Cited

U.S. PATENT DOCUMENTS

| | | | |
|---|---|---|---|
| 6,169,708 B1 * | 1/2001 | Kaneko et al. | 368/84 |
| 7,230,271 B2 | 6/2007 | Yamazaki et al. | |
| 7,327,421 B2 * | 2/2008 | Kaneko | 349/114 |
| 2004/0061118 A1 * | 4/2004 | Yamazaki et al. | 257/79 |
| 2004/0090588 A1 * | 5/2004 | Kim et al. | 349/158 |

* cited by examiner

*Primary Examiner* — Wai Sing Louie
*Assistant Examiner* — Bilkis Jahan
(74) *Attorney, Agent, or Firm* — Brinks Hofer Gilson & Lione

(57) ABSTRACT

Provided is a flat panel display device and a method for fabricating the same. The flat panel display device comprises a first substrate, a light emitting unit, a second substrate, and insulating films. The light emitting unit comprises thin film transistors positioned on the first substrate, a first electrode electrically connecting with the thin film transistors, a second electrode facing the first electrode, and an emission layer or a liquid crystal layer interposed between the first and second electrodes. The second substrate is sealed with the first substrate by an ultraviolet curing sealant, and has a greater thermal expansion coefficient than the first substrate. The insulating films are positioned on one or more surfaces of the first and/or second substrates.

2 Claims, 2 Drawing Sheets

METHOD FOR FABRICATING FLAT PANEL DISPLAY DEVICE

This application is a divisional of U.S. patent application Ser. No. 11/639,698 filed on Dec. 14, 2006, which claims the benefit of Korea Patent Application No. 10-2006-0044353, filed on May 17, 2006, the entire contents of which is incorporated herein by reference for all purposes as if fully set forth herein.

BACKGROUND

1. Field of the Invention

The present invention relates to a flat panel display device and a method for fabricating the same.

2. Discussion of the Related Art

In recent years, flat panel displays (FPD) are increasing in importance as multimedia is developed. In response to this, several flat type displays such as liquid crystal display (LCD), plasma display panel (PDP), field emission display (FED), and organic light emitting device (OLED) are being put to practical use. Among them, the liquid crystal display has an excellent visibility, and has lower average consumption power and heat release rate compared with a cathode ray tube. The field emission display is attracting attention as a next generation flat panel display device because it has a great response speed of 1 ms or less, has low power consumption, and has no viewing angle problems because of its self-emission.

Methods for driving flat panel display devices are classified into a passive matrix method, and an active matrix method using a thin film transistor (TFT). The passive matrix method is a method in which an anode and a cathode are formed to cross at right angles, and a line is selected, thereby driving the flat panel display device. In comparison with this, the active matrix method is a method in which the thin film transistor connects to each pixel electrode of indium tin oxide (ITO), and the flat panel display device is driven depending on a voltage sustained by the capacitance of a capacitor connecting to a gate electrode of the thin film transistor.

FIG. 1 is a cross-sectional view illustrating a conventional flat panel display device. Referring to FIG. 1, the flat panel display device comprises a first substrate 100, a light emitting unit 110, and a second substrate 120 opposing the first substrate 100. The first substrate 100 and the second substrate 120 are sealed by a sealant 130, thereby sealing the light emitting unit 110. The light emitting unit 110 may comprise a first electrode, a second electrode, and an emission layer or a liquid crystal layer interposed between the first and second electrodes. The flat panel display device based on the active matrix method may further comprise a thin film transistor electrically connecting with the first electrode.

A substrate used for the flat panel display device may be made of glass, plastic, or metal. In general, the substrate formed of glass is typically used. The glass may be a non-alkali glass, a soda lime glass, or a borosilicate glass. The non-alkali glass contains less than 0.1 wt % of $Na_2O$, the borosilicate glass contains 0.1 wt % to 1 wt % of $Na_2O$, and the soda lime glass contains more than 1 wt % of $Na_2O$. The soda lime glass is also called an alkali glass.

In the flat panel display device comprising the thin film transistor based on the active matrix method, non-alkali glass is typically employed as the first substrate. This is to protect the thin film transistor from alkali ions diffused from the substrate in a process of fabricating the thin film transistor. In other words, when the alkali ions are diffused into a channel region of a semiconductor layer, the alkali ions change a semiconductive property of the channel region into a conductive property. This deteriorates an off characteristic of the thin film transistor, increases a leakage current, and causes a residual image while driving the display. Accordingly, it is desirable to employ non-alkali glass in the first substrate in a flat panel display device using the active matrix method, in order to solve the above problems. However, the non-alkali glass substrate is more expensive than other glass substrates and thus, may increase a price of the flat panel display device. In order to reduce a manufacture cost, the first substrate having the thin film transistor may employ the non-alkali glass, and the second substrate sealed with the first substrate may employ the soda lime glass.

The first substrate comprising the thin film transistor and the light emitting unit is sealed with the second substrate by the sealant, thereby sealing the light emitting unit formed on the first substrate. In order to cure the sealant, the sealant is subject to irradiation of ultraviolet rays and then, is heat-treated for about one hour at a temperature of about 230° C.

The heat treatment causes a thermal expansion of the sealed first substrate and second substrate. Because the first substrate and the second substrate are of materials different from each other, there is a drawback in that the sealed first substrate and second substrate are bent in one direction as shown in FIG. 1. In other words, a difference between thermal expansion coefficients of two substrates may cause the bending of the flat panel display device. This causes a deterioration of yield and a reduction of reliability.

BRIEF SUMMARY

Accordingly, the present invention is to provide a flat panel display device and a method for fabricating the same, for preventing bending in a sealing process, and improving yield and reliability.

In one aspect, there is provided a flat panel display device. The flat panel display device comprises a first substrate, a light emitting unit, a second substrate, and insulating films. The light emitting unit comprises thin film transistors positioned on the first substrate, a first electrode electrically connecting with the thin film transistors, a second electrode facing the first electrode, and an emission layer or a liquid crystal layer interposed between the first and second electrodes. The second substrate has a greater thermal expansion coefficient than the first substrate and is sealed with the first substrate by an ultraviolet curing sealant. The insulating films are positioned on one or more surfaces of the first and/or second substrates.

In another aspect, there is provided a method for fabricating a flat panel display device. The method comprises preparing a first substrate, and a second substrate having a greater thermal expansion coefficient than the first substrate. An insulating film is formed on one or more surfaces of any one of the first and second substrates. A light emitting unit is formed on the first substrate. The light emitting unit comprises thin film transistors, a first electrode connecting with the thin film transistors, a second electrode facing the first electrode, and an emission layer or a liquid crystal layer interposed between the first and second electrodes. The first and second substrates are sealed using a sealant.

It is to be understood that both the foregoing general description and the following detailed description are exemplary and explanatory and are intended to provide further explanation of the invention as claimed.

BRIEF DESCRIPTION OF THE DRAWINGS

The invention will be described in detail with reference to the following drawings in which like numerals refer to like elements.

DETAILED DESCRIPTION OF THE DRAWINGS AND THE PRESENTLY PREFERRED EMBODIMENTS

Figure 1:
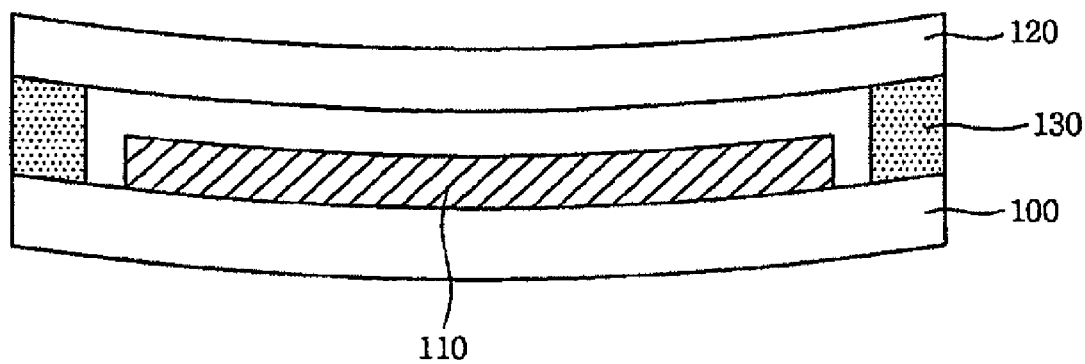
FIG. 1 is a cross-sectional view illustrating a conventional flat panel display device.

Embodiments of the present invention will be described in a more detailed manner with reference to the drawings. However, the described embodiments may be corrected in a different way, all without departing from the spirit or scope of the present invention. In the drawings, when any layer is formed "on" another layer or substrate, it means that any layer may be directly formed on another layer or substrate, or a third layer may be interposed therebetween. Like reference numerals designate like elements throughout the specification.

Figure 2:
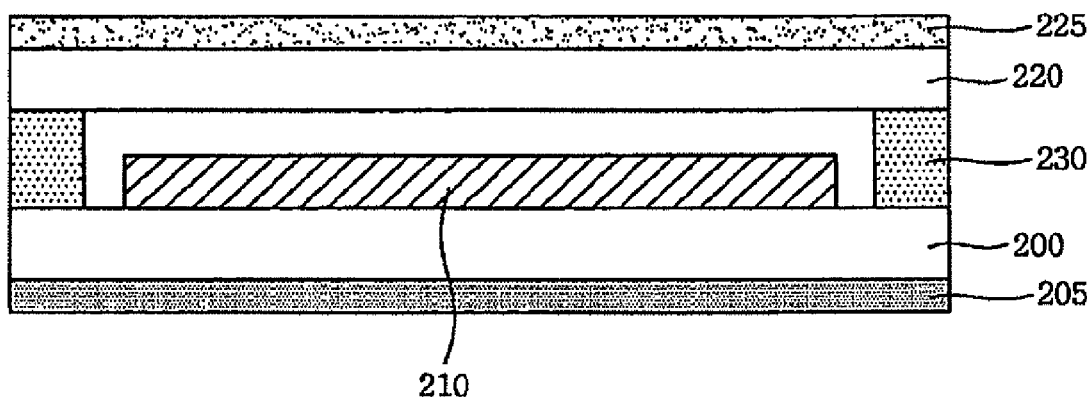
FIG. 2 is a cross-sectional view illustrating a flat panel display device according to an embodiment of the present invention.
Figure 3:
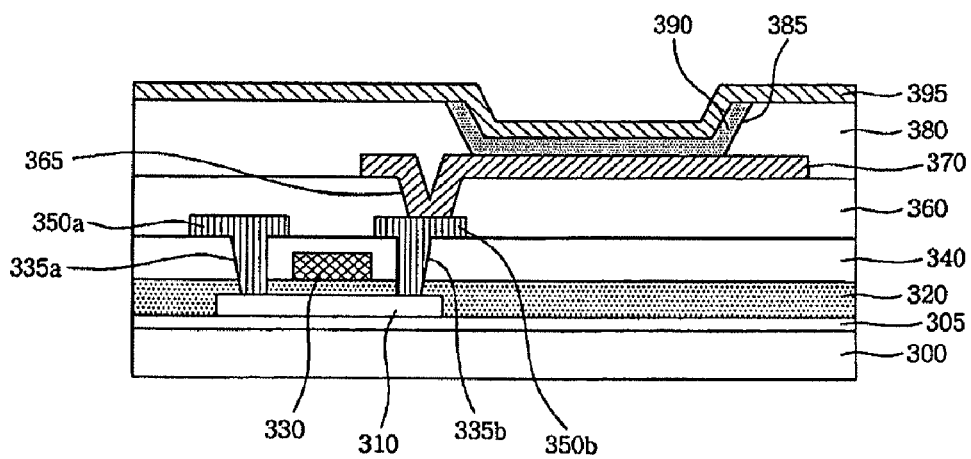
FIG. 3 is a cross-sectional view illustrating a pixel structure of a flat panel display device according to an embodiment of the present invention.

FIG. 2 is a cross-sectional view illustrating a flat panel display device according to an embodiment of the present invention. FIG. 3 is a cross-sectional view illustrating a pixel structure of a flat panel display device according to an embodiment of the present invention.

Referring to FIG. 2, the flat panel display device according to an embodiment of the present invention comprises a first substrate 200, and a second substrate 220 facing the first substrate 200 and having a greater thermal expansion coefficient than the first substrate 200. The first substrate 200 may be of non-alkali glass in order to prevent thin film transistors to be subsequently formed on the first substrate 200 from being contaminated by alkali ions. The second substrate 220 may be a soda lime glass substrate or a borosilicate glass substrate. The non-alkali glass has a thermal expansion coefficient of about $38 \times 10^{-7}/°$ C., and the soda lime glass has a thermal expansion coefficient of about $90 \times 10^{-7}/°$ C. A first insulating film 205 is positioned on an outer surface of the first substrate 200. A second insulating film 225 is positioned on an outer surface of the second substrate 220. The first and second insulating films 205 and 225 may have a thermal expansion coefficient of 0 or less. In other words, the first and second insulating films 205 and 225 may comprise material having a thermal expansion coefficient of 0 or less, such as aluminum oxide ($Al_2O_3$), yttrium oxide ($Y_2O_3$), and silicon nitride ($Si_3N_4$). The first and second insulating films 205 and 225 may be formed at a thickness of about 50 Å to 5000 Å using the well-known process such as plasma enhanced chemical vapor deposition (PECVD) or low-pressure chemical vapor deposition (LPCVD).

In contrast, the first insulating film 205 may have a greater thermal expansion coefficient than the first substrate 200, and the second insulating film 225 may have a less thermal expansion coefficient than the second substrate 220.

The first insulating film 205 or the second insulating film 225 may be of transparent material depending on the direction in which light is emitted from the flat panel display device. In other words, in a top-emission flat panel display device, the second insulating film 225 should be of transparent material.

A light emitting unit 210 is positioned on the first substrate 200 comprising the first insulating film 205. The light emitting unit 210 comprises a plurality of pixels. Each pixel may comprise a thin film transistor, a first electrode, a second electrode, and an emission layer or a liquid crystal layer interposed between the first and second electrodes. The pixel structure of the flat panel display device according to an embodiment of the present invention will be described below with reference to FIG. 3.

Referring to FIG. 3, a buffer layer 305 is positioned on the first substrate 300. The thin film transistor comprises a semiconductor layer 310, a gate insulating layer 320, a gate electrode 330, and source/drain electrodes 350a and 350b, and is positioned on the buffer layer 305. The semiconductor layer 310 may be of amorphous silicon or polycrystalline silicon. Impurity ions may be implanted into the semiconductor layer 310, thereby forming source, drain, and channel regions in the semiconductor layer 310. The gate electrode 330 is positioned on the gate insulating layer 320 so that it corresponds to a predetermined region of the semiconductor layer 310. The gate electrode 330 and the source/drain electrodes 350a and 350b are insulated with each other using an inter-insulating layer 340. The source/drain electrodes 350a and 350b electrically are connected to portions of the semiconductor layer 310 through a first contact hole 335a and a second contact hole 335b positioned in the inter-insulating layer 340 and the gate insulating layer 320. A passivation layer 360 is positioned on the above constructed thin film transistor. A via hole 365 is positioned in the passivation layer 360, and exposes the drain electrode 350b of the thin film transistor. The first electrode 370 is positioned on the passivation layer 360, and connects with the drain electrode 350b of the thin film transistor through the via hole 365. A pixel defining film 380 is positioned on the first electrode 370, and comprises an opening 385 for exposing a part of the first electrode 370. The emission layer 390 is of organic matter, and is positioned in the opening 385. The second electrode 395 is positioned on the pixel defining film 380 comprising the emission layer 390.

In an embodiment of the present invention as described, the emission layer is interposed between the first electrode and the second electrode, but the liquid crystal layer may be also interposed between the first electrode and the second electrode.

Referring again to FIG. 2, the first substrate 200 comprising the first insulating film 205 and the light emitting unit 210 and the second substrate 220 comprising the second insulating film 225 are sealed using a sealant 230, thereby sealing the light emitting unit 210. The sealant 230 may be an ultraviolet curing sealant. The sealant 230 may be coated and then, may be cured using a heat-treatment for one hour or more at a high temperature of 200° C. or more.

As discussed above, in a conventional flat panel display device, a phenomenon occurs in which the flat panel display device is bent in a heat-treatment process due to the difference between the thermal expansion coefficients of the first substrate 200 and the second substrate 220. However, in the flat panel display device according to an embodiment of the present invention, the first insulating film 205 and the second insulating film 225 are formed on one or more surfaces of the first substrate 200 and the second substrate 220 to prevent the bending phenomenon.

If the first and second insulating films 205 and 225 are of material having the thermal expansion coefficient of 0 or less, they are not thermally expanded even though the flat panel display device is under a high temperature for a long time in a sealing process using the sealant. Thus, a phenomenon in which the first and second substrates 200 and 220 are bent due to the difference between the thermal expansion coefficients may be suppressed, thereby preventing the bending of the flat panel display device.

The first insulating film 205 comprises material having a greater thermal expansion coefficient than the first substrate 200, and the second insulating film 225 comprises material having a less thermal expansion coefficient than the second substrate 220. If so, the difference between the thermal expansion coefficients of the first and second substrates 200 and 220 may be compensated. Accordingly, the bending of the flat panel display device may be prevented in the heat-treatment process.

Table 1 below shows thermal expansion coefficients of materials that may be used as the insulating films.

TABLE 1

| Material | Thermal expansion coefficient |
| --- | --- |
| $Si_3N_4$ | 0 (up to 1200° C.) |
| $Y_2O_3$ | 0 (up to 1000° C.) |
| $SiO_2$ | $5 \times 10^{-7}/°$ C. |
| $Ge_2O$ | $77 \times 10^{-7}/°$ C. |
| $B_2O_3$ | $150 \times 10^{-7}/°$ C. |
| $Al_2O_3$ | $6 \times 10^{-7}/°$ C. |

In the described embodiment of the present invention the first and second insulating films 205 and 225 are positioned on the outer surfaces of the first and second substrates 200 and 220, but they may be either positioned on inner surfaces or both surfaces of the first and second substrates 200 and 220, without departing from the sprit and scope of the present invention.

Figure 4:
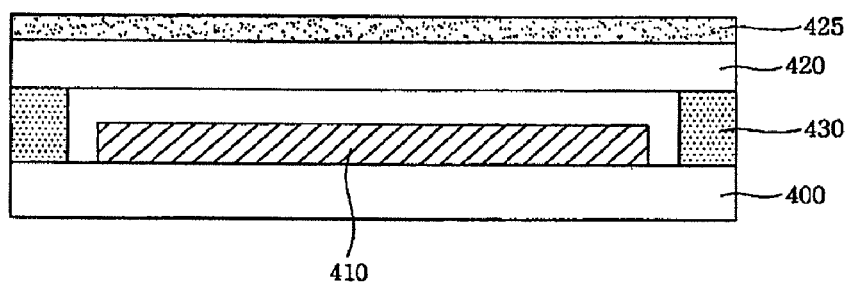
FIG. 4 is a cross-sectional view illustrating a flat panel display device according to another embodiment of the present invention.

FIG. 4 is a cross-sectional view illustrating a flat panel display device according to another embodiment of the present invention. Referring to FIG. 4, the flat panel display device according to another embodiment of the present invention comprises a first substrate 400, and a second substrate 420 facing the first substrate 400 and having a greater thermal expansion coefficient than the first substrate 400. The first substrate 400 may be a non-alkali glass substrate, and the second substrate 420 may be a soda lime glass substrate or a borosilicate glass substrate.

A second insulating film 425 is positioned on an outer surface of the second substrate 420. A thermal expansion coefficient of the second insulating film 425 may be smaller than a thermal expansion coefficient of the second substrate 420.

A light emitting unit 410 is positioned on the first substrate 400. The light emitting unit 410 is comprised of a plurality of pixels. Each pixel may comprise at least one thin film transistor, a first electrode connecting with the thin film transistor, a second electrode facing the first electrode, and an emission layer or a liquid crystal layer interposed between the first and second electrodes.

The first substrate 400 comprising the light emitting unit 410, and the second substrate 420 comprising the insulating film 425 are sealed using a sealant 430, thereby sealing the light emitting unit 410. The sealant 430 may be an ultraviolet curing sealant. A heat-treatment process may be performed in a high temperature for a long time to cure the sealant 430.

In the flat panel display device according to another embodiment of the present invention, the second insulating film 425 having a less thermal expansion coefficient than the second substrate 420 is positioned on the second substrate 420 having a greater thermal expansion coefficient than the first substrate 400. Thus, the second insulating film 425 may cause a reduction of the difference between the thermal expansion coefficients of the first substrate 400 and the second substrate 420. Therefore, a phenomenon in which the flat panel display device is bent in the heat-treatment process may be prevented.

Figure 5:
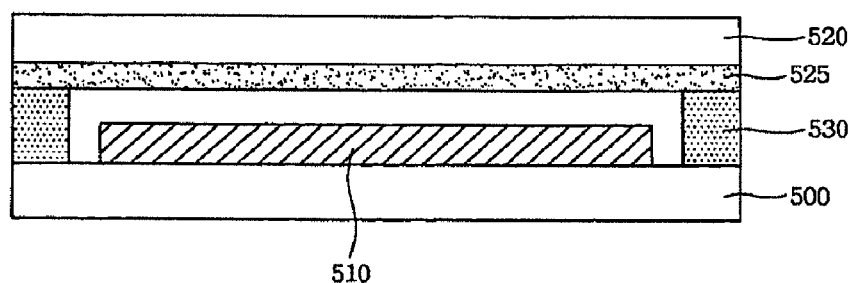
FIG. 5 is a cross-sectional view illustrating a flat panel display device according to a further another embodiment of the present invention.

FIG. 5 is a cross-sectional view illustrating a flat panel display device according to a further another embodiment of the present invention. Referring to FIG. 5, the flat panel display device according to a further another embodiment of the present invention comprises a first substrate 500, a light emitting unit 510 positioned on the first substrate 500, and a second substrate 520 that is sealed with the first substrate 500 by a sealant 530 to seal the light emitting unit 510 and comprises an insulating film 525 on its inner surface.

The flat panel display device according to a further another embodiment of the present invention is different only in the position of its insulating film, from the flat panel display device according to another embodiment of the present invention. In other words, the second insulating film 525 having the less thermal expansion coefficient than the second substrate 520 is formed on the inner surface of the second substrate 520 to reduce the difference between the thermal expansion coefficients of the first substrate 500 and the second substrate 520.

In FIGS. 4 and 5, it is shown that the insulating film having the less thermal expansion coefficient than the second substrate is positioned on any one surface of the second substrate, but it is not intended to limit the present invention. In other words, the insulating film having the less thermal expansion coefficient than the second substrate may be positioned on both surfaces of the second substrate. Alternately, the insulating film having the greater thermal expansion coefficient than the first substrate may be positioned on any one surface of the first substrate.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

The invention claimed is:

1. A method for fabricating a flat panel display device, the method comprising:
   preparing a first substrate, and a second substrate having a greater thermal expansion coefficient than the first substrate;
   forming a first insulating film on an outer surface of the first substrate, wherein the first insulating film has a first thermal expansion coefficient;
   forming a light emitting unit on an inner surface of the first substrate, the light emitting unit comprising thin film transistors, a first electrode connecting with the thin film transistors, a second electrode opposing the first electrode, and an emission layer interposed between the first and second electrodes;
   forming a second insulating film on an outer surface of the second substrate, wherein the second insulating film has a second thermal expansion coefficient; and
   sealing the first and second substrates using a sealant, wherein the first thermal expansion coefficient is larger than the thermal expansion coefficient of the first substrate and the second thermal expansion coefficient is less than the thermal expansion coefficient of the second substrate to cancel of the thermal expansion coefficient between the first substrate and the second substrate.

2. The method of claim 1, wherein the first insulating film and the second insulating film comprise material having a thermal expansion coefficient of 0 or less.

* * * * *